(12) United States Patent
Gaskill

(10) Patent No.: US 11,523,542 B2
(45) Date of Patent: Dec. 6, 2022

(54) CONFORMAL MEMORY HEATSINK

(71) Applicant: Dell Products L.P., Round Rock, TX (US)

(72) Inventor: Travis Gaskill, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 17/224,862

(22) Filed: Apr. 7, 2021

(65) Prior Publication Data

US 2022/0330460 A1    Oct. 13, 2022

(51) Int. Cl.
*H05K 7/20* (2006.01)
*H05K 1/02* (2006.01)
*G06F 1/20* (2006.01)

(52) U.S. Cl.
CPC .......... *H05K 7/20709* (2013.01); *G06F 1/20* (2013.01); *H05K 1/021* (2013.01)

(58) Field of Classification Search
CPC .............. H05K 7/20709; H05K 1/021; H05K 7/20509; H05K 2201/10159; H05K 7/20254; H05K 1/0203; H05K 2201/10545; G06F 1/20; G06F 1/185; G06F 2200/201; G06F 1/184; G06F 1/16; H01L 23/4093; H01L 23/427; H01L 23/3672; H01L 23/473; F28D 15/0275
USPC ..... 361/699, 704, 719, 679.46, 700, 679.52, 361/702, 715, 679.32, 720, 711, 792, 748; 165/80.4, 104.33, 80.3; 257/E23.103, 257/706
See application file for complete search history.

(56) References Cited

U.S. PATENT DOCUMENTS

| | | | |
|---|---|---|---|
| 8,587,943 B2* | 11/2013 | Barina | H01L 23/427 361/720 |
| 9,158,348 B2* | 10/2015 | Berk | G06F 1/20 |
| 9,543,226 B1* | 1/2017 | Nuttall | H01L 23/13 |
| 10,667,431 B1* | 5/2020 | Lunsman | H05K 7/20254 |
| 11,011,449 B1* | 5/2021 | Qu | H01L 23/3672 |
| 11,304,343 B1* | 4/2022 | Chen | H01L 23/427 |
| 2018/0004259 A1* | 1/2018 | Kulkarni | F25B 21/02 |
| 2019/0029146 A1* | 1/2019 | Cuda | H05K 7/20809 |
| 2021/0204446 A1* | 7/2021 | Qu | H05K 1/181 |
| 2021/0321528 A1* | 10/2021 | Curtis | H05K 5/0021 |
| 2022/0225542 A1* | 7/2022 | Subrahmanyam | G11C 5/04 |

FOREIGN PATENT DOCUMENTS

WO    WO-2011053313 A1 *    5/2011  ............... G06F 1/20

* cited by examiner

*Primary Examiner* — Mandeep S Buttar
(74) *Attorney, Agent, or Firm* — Jackson Walker L.L.P.

(57) ABSTRACT

An information handling system may include a circuit board that includes a plurality of memory module sockets; a plurality of memory modules received in the plurality of memory module sockets; a plurality of heatsinks disposed between adjacent ones of the plurality of memory modules; and a cold plate having projections that extend into regions between adjacent ones of the plurality of heatsinks.

20 Claims, 8 Drawing Sheets

CONFORMAL MEMORY HEATSINK

TECHNICAL FIELD

The present disclosure relates in general to information handling systems, and more particularly to memory cooling techniques for information handling systems.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Memory modules such as dual in-line memory modules (DIMMs) in information handling systems can generate a significant amount of heat that needs to be dissipated for proper operation. Due in part to the form factor of memory modules and their typical arrangement within a system, it can be a challenge to provide adequate cooling. For example, typically there is not enough room for large traditional heatsinks on memory modules, and limited airflow between modules is also an issue.

Accordingly, embodiments of this disclosure provide improved techniques for cooling memory modules.

It should be noted that the discussion of a technique in the Background section of this disclosure does not constitute an admission of prior-art status. No such admissions are made herein, unless clearly and unambiguously identified as such.

SUMMARY

In accordance with the teachings of the present disclosure, the disadvantages and problems associated with memory cooling may be reduced or eliminated.

In accordance with embodiments of the present disclosure, an information handling system may include a circuit board that includes a plurality of memory module sockets; a plurality of memory modules received in the plurality of memory module sockets; a plurality of heatsinks disposed between adjacent ones of the plurality of memory modules; and a cold plate having projections that extend into regions between adjacent ones of the plurality of heatsinks.

In accordance with these and other embodiments of the present disclosure, a method may include coupling a plurality of memory modules to a plurality of heatsinks to form a group, such that in the group, the plurality of heatsinks are disposed between adjacent ones of the plurality of memory modules; inserting the memory modules of the group simultaneously into a plurality of memory module sockets disposed on a circuit board; and thermally coupling a cold plate to the group such that projections of the cold plate extend into regions between adjacent ones of the plurality of heatsinks.

In accordance with these and other embodiments of the present disclosure, an apparatus may include a group comprising a plurality of memory modules coupled to a plurality of heatsinks, such that in the group, the plurality of heatsinks are disposed between adjacent ones of the plurality of memory modules; and a cold plate thermally coupled to the group such that projections of the cold plate extend into regions between adjacent ones of the plurality of heatsinks; wherein the memory modules of the group are simultaneously insertable into a plurality of memory module sockets disposed on a circuit board.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
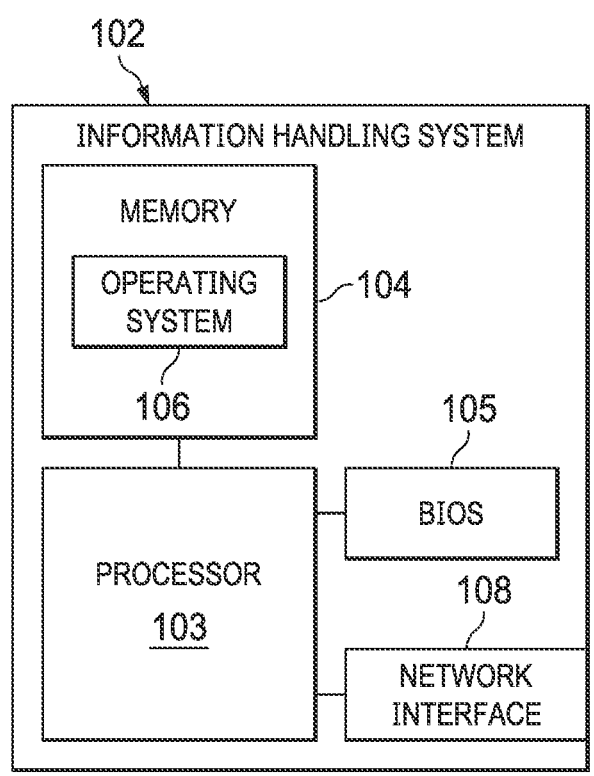
FIG. 1 illustrates a block diagram of an example information handling system, in accordance with embodiments of the present disclosure.

Preferred embodiments and their advantages are best understood by reference to FIGS. 1 through 5B, wherein like numbers are used to indicate like and corresponding parts. For the purposes of this disclosure, the term "information handling system" may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a personal digital assistant (PDA), a consumer electronic device, a network storage device, or any other suitable device and may vary in size, shape, performance, functionality, and price. The information handling system may include memory, one or more processing resources such as a central processing unit ("CPU") or hardware or software control logic. Additional components of the information handling system may include one or more storage devices, one or more communications ports for communicating with external devices as well as various input/output ("I/O") devices, such as a keyboard, a mouse, and a video display. The information handling system may also include one or more buses operable to transmit communication between the various hardware components.

For purposes of this disclosure, when two or more elements are referred to as "coupled" to one another, such term indicates that such two or more elements are in electronic communication or mechanical communication, as applicable, whether connected directly or indirectly, with or without intervening elements.

When two or more elements are referred to as "coupleable" to one another, such term indicates that they are capable of being coupled together.

For the purposes of this disclosure, the term "computer-readable medium" (e.g., transitory or non-transitory computer-readable medium) may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory; communications media such as wires, optical fibers, microwaves, radio waves, and other electromagnetic and/or optical carriers; and/or any combination of the foregoing.

For the purposes of this disclosure, the term "information handling resource" may broadly refer to any component system, device, or apparatus of an information handling system, including without limitation processors, service processors, basic input/output systems, buses, memories, I/O devices and/or interfaces, storage resources, network interfaces, motherboards, and/or any other components and/or elements of an information handling system.

FIG. 1 illustrates a block diagram of an example information handling system 102, in accordance with embodiments of the present disclosure. In some embodiments, information handling system 102 may comprise a server chassis configured to house a plurality of servers or "blades." In other embodiments, information handling system 102 may comprise a personal computer (e.g., a desktop computer, laptop computer, mobile computer, and/or notebook computer). In yet other embodiments, information handling system 102 may comprise a storage enclosure configured to house a plurality of physical disk drives and/or other computer-readable media for storing data (which may generally be referred to as "physical storage resources"). As shown in FIG. 1, information handling system 102 may comprise a processor 103, a memory 104 communicatively coupled to processor 103, a BIOS 105 (e.g., a UEFI BIOS) communicatively coupled to processor 103, a network interface 108 communicatively coupled to processor 103. In addition to the elements explicitly shown and described, information handling system 102 may include one or more other information handling resources.

Processor 103 may include any system, device, or apparatus configured to interpret and/or execute program instructions and/or process data, and may include, without limitation, a microprocessor, microcontroller, digital signal processor (DSP), application specific integrated circuit (ASIC), or any other digital or analog circuitry configured to interpret and/or execute program instructions and/or process data. In some embodiments, processor 103 may interpret and/or execute program instructions and/or process data stored in memory 104 and/or another component of information handling system 102.

Memory 104 may be communicatively coupled to processor 103 and may include any system, device, or apparatus configured to retain program instructions and/or data for a period of time (e.g., computer-readable media). Memory 104 may include RAM, EEPROM, a PCMCIA card, flash memory, magnetic storage, opto-magnetic storage, or any suitable selection and/or array of volatile or non-volatile memory that retains data after power to information handling system 102 is turned off.

As shown in FIG. 1, memory 104 may have stored thereon an operating system 106. Operating system 106 may comprise any program of executable instructions (or aggregation of programs of executable instructions) configured to manage and/or control the allocation and usage of hardware resources such as memory, processor time, disk space, and input and output devices, and provide an interface between such hardware resources and application programs hosted by operating system 106. In addition, operating system 106 may include all or a portion of a network stack for network communication via a network interface (e.g., network interface 108 for communication over a data network). Although operating system 106 is shown in FIG. 1 as stored in memory 104, in some embodiments operating system 106 may be stored in storage media accessible to processor 103, and active portions of operating system 106 may be transferred from such storage media to memory 104 for execution by processor 103.

Network interface 108 may comprise one or more suitable systems, apparatuses, or devices operable to serve as an interface between information handling system 102 and one or more other information handling systems via an in-band network. Network interface 108 may enable information handling system 102 to communicate using any suitable transmission protocol and/or standard. In these and other embodiments, network interface 108 may comprise a network interface card, or "NIC." In these and other embodiments, network interface 108 may be enabled as a local area network (LAN)-on-motherboard (LOM) card.

Memory 104 may include one or more memory modules such as single in-line memory modules (SIMMs), dual in-line memory modules (DIMMs), non-volatile DIMMs (NVDIMMs), etc. The example of DIMMs will generally be discussed in detail in this disclosure for the sake of concreteness, but one of ordinary skill in the art will appreciate that embodiments may also be used with other types of memory modules.

According to some embodiments of this disclosure, heatsinks may be coupled to DIMMs, and the heatsinks may transfer heat to a cold plate. In one embodiment, the cold plate may include flow channels for liquid cooling. A pump may convey a liquid coolant (e.g., water, alcohol, oil, etc.) through such flow channels and to a radiator, which may in turn be cooled by an air mover such as a fan, a blower, etc. In other embodiments, the liquid coolant may also be cooled by a liquid-to-liquid heat exchanger or any other heat exchange device that uses liquid as one of its working fluids. The flow channels may include internal fins to increase surface area and aid in the transmission of heat from the cold plate to the liquid coolant. The liquid cooling system may also in some embodiments convey the liquid coolant across other heat-generating components (e.g., processors, GPUs, etc.) before it travels to a radiator.

In other embodiments, the cold plate may be configured for direct air cooling instead of liquid cooling. For example, it may include external fins that are directly cooled by an air mover instead of flow channels usable for liquid cooling. For example, the cold plate may include fins disposed on a surface thereof that is opposite the location of the heatsinks, and an air mover may be configured to blow air laterally across such fins.

Figure 2:
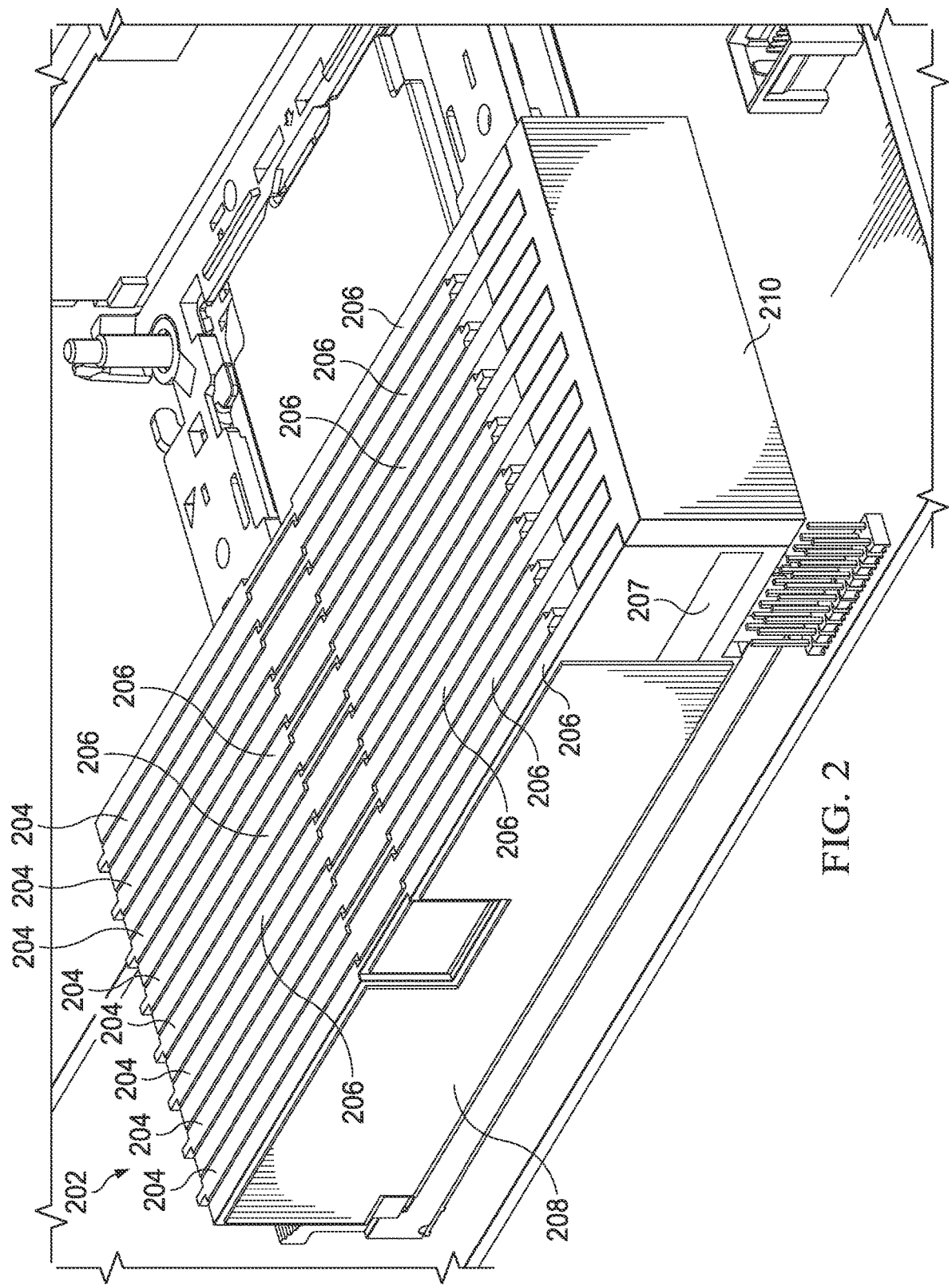
FIG. 2 illustrates a plurality of memory modules with heatsinks, in accordance with embodiments of the present disclosure.

Turning now to FIG. 2, a view is shown of selected components of information handling system 202. Heatsinks 206 may conform to the space between DIMMs 204. In some embodiments, gap pads 208 (e.g., comprising thermal interface material) may be placed between DIMMs 204 and heatsinks 206. In particular, any differences in the thickness of DIMMs 204 can be compensated for by using gap pads 208 having different thicknesses. Heatsinks 206 and/or gap pads 208 may be dimensioned so as to be conformal with any surface features (e.g., memory chips, surface mount components, etc.) of DIMMs 204. In some embodiments, gap pads 208 may include adhesive (e.g., thermal epoxy or the like) in order to bond heatsinks 206 to DIMMs 204.

As shown, heatsinks 206 may also be in physical contact with cold plate 210. In some embodiments, a small gap (e.g., 0.01 inches) may exist between heatsinks 206 and cold plate 210, in order to allow space for a layer of thermal grease or the like to facilitate heat transfer.

Heatsinks 206 may thus transfer the heat of DIMMs 204 to cold plate 210, which may be located past one or both ends of the DIMMs 206 in some embodiments. As shown in FIG. 2, cold plate 210 may be formed to include finger-like projections that fit between adjacent ones of heatsinks 206.

In some embodiments, heatsinks 206 may include heatpipes 207 to aid in the transfer of heat toward cold plate 210. In other embodiments, heatsinks 206 may include vapor chambers therein. In yet other embodiments, heatsinks 206 may be solid metal (e.g., aluminum, copper, or any other suitable material).

The arrangement shown in FIG. 2 may in some embodiments be constructed by assembling heatsinks 206 and DIMMs 204 to form a group prior to the insertion of DIMMs 204 into their sockets. DIMMs 204 may then all be inserted simultaneously in a group into their respective sockets.

Figure 3A:
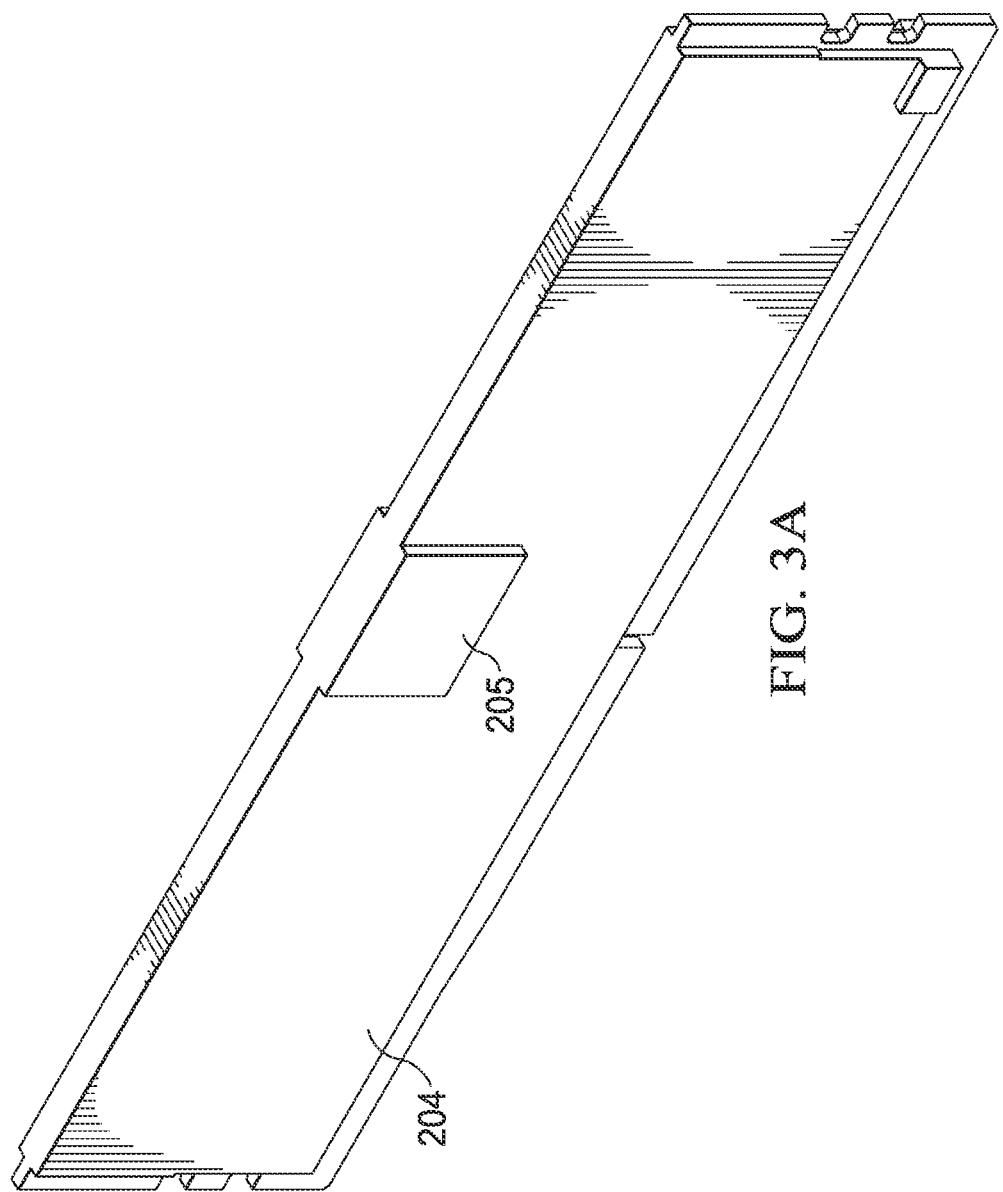
FIGS. 3A-3C illustrate detail views of the components of FIG. 2, in accordance with embodiments of the present disclosure.
Figure 3B:
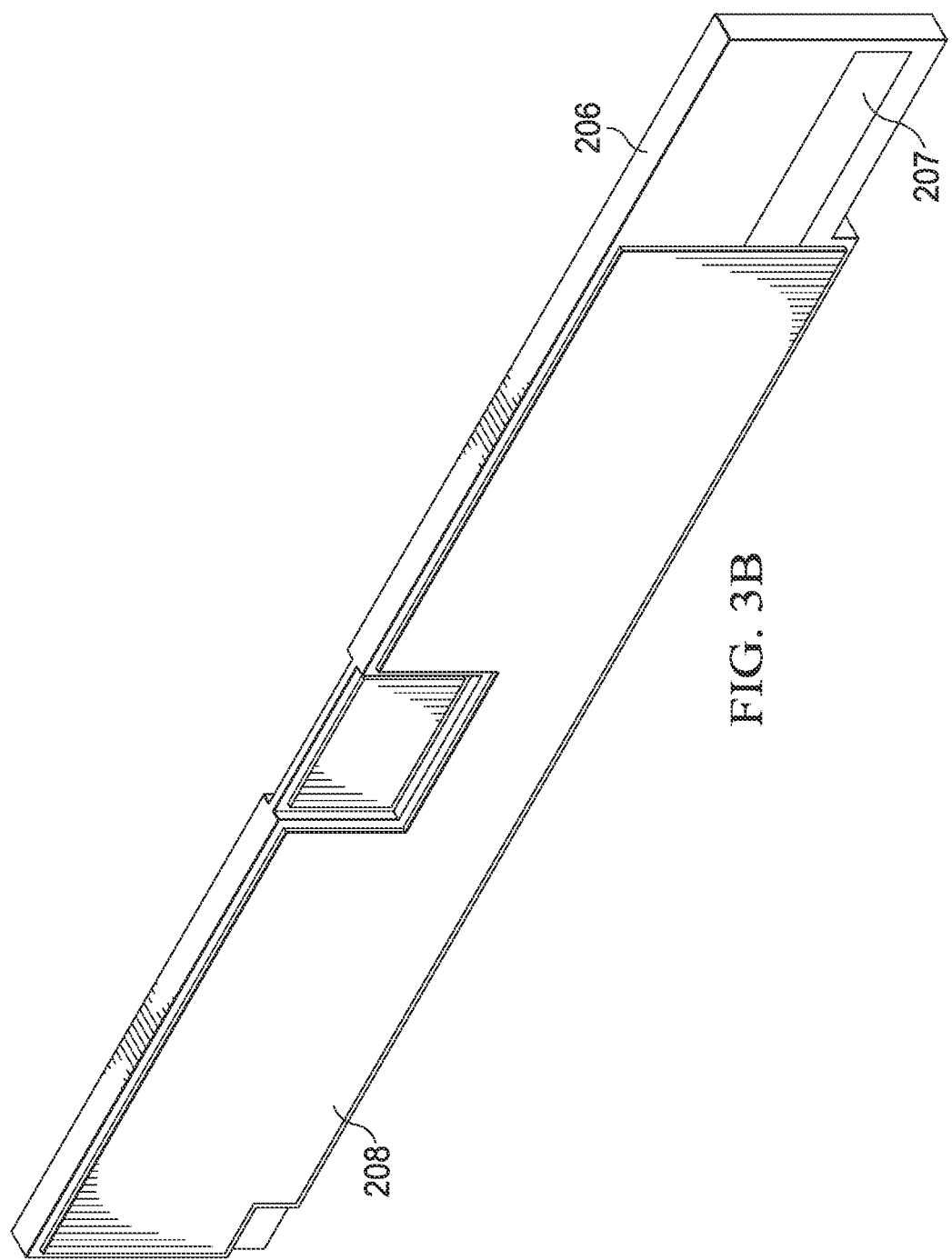
Figure 3C:
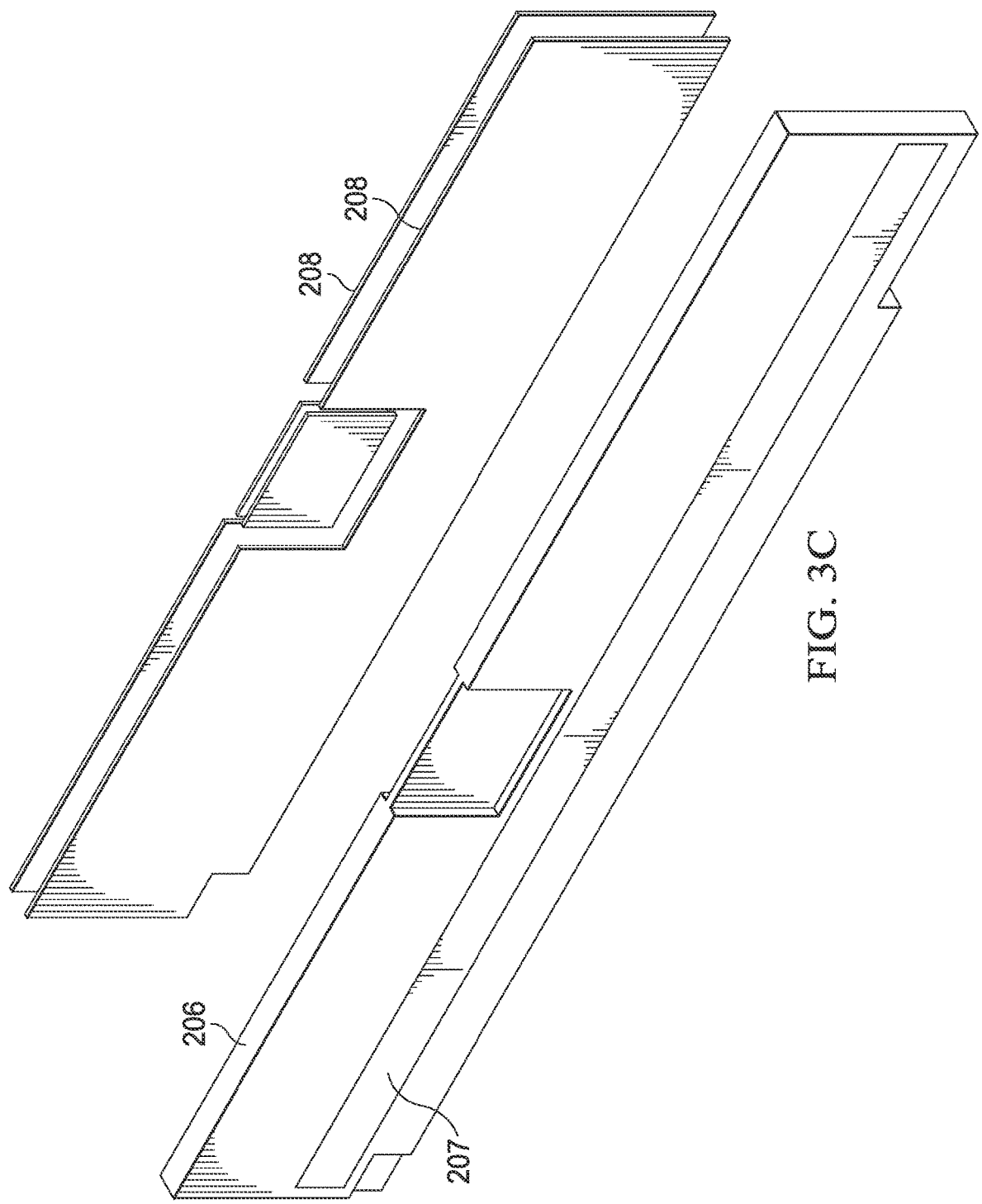

Turning now to FIG. 3 (which includes FIGS. 3A, 3B, and 3C), exploded views are shown of some of the components of FIG. 2.

As shown in FIG. 3A, DIMM 204 may include circuit 205. Circuit 205 may be a power management integrated circuit (PMIC) of the type typically used on DDR5 DIMMs, or it may be any other circuitry disposed on DIMM 204. Although not shown specifically, additional circuitry such as memory chips, surface-mount components, etc. may also be included on DIMM 204. In some embodiments, gap pad 208 and/or heatsink 206 may include surface features operable to conform to such circuitry. In other embodiments, gap pad 208 and/or heatsink 206 may include surface features operable to conform to some portions of such circuitry (e.g., the circuitry elements having the highest power dissipation).

Figure 4A:
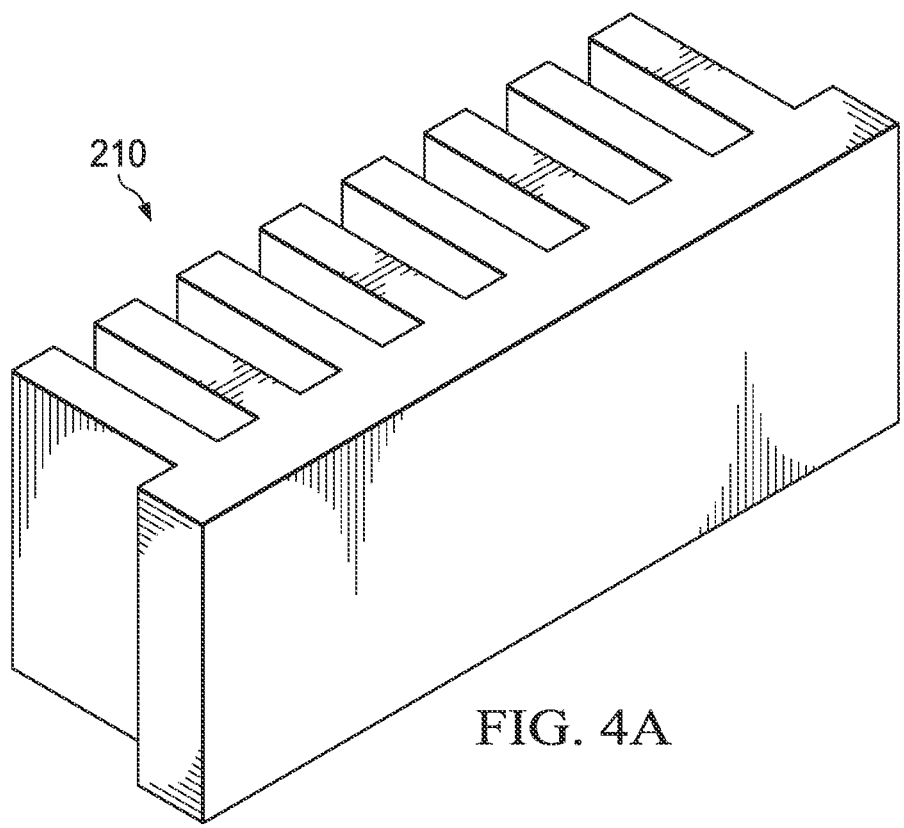
FIGS. 4A-4C illustrate detail views of a cold plate, in accordance with embodiments of the present disclosure.
Figure 4B:
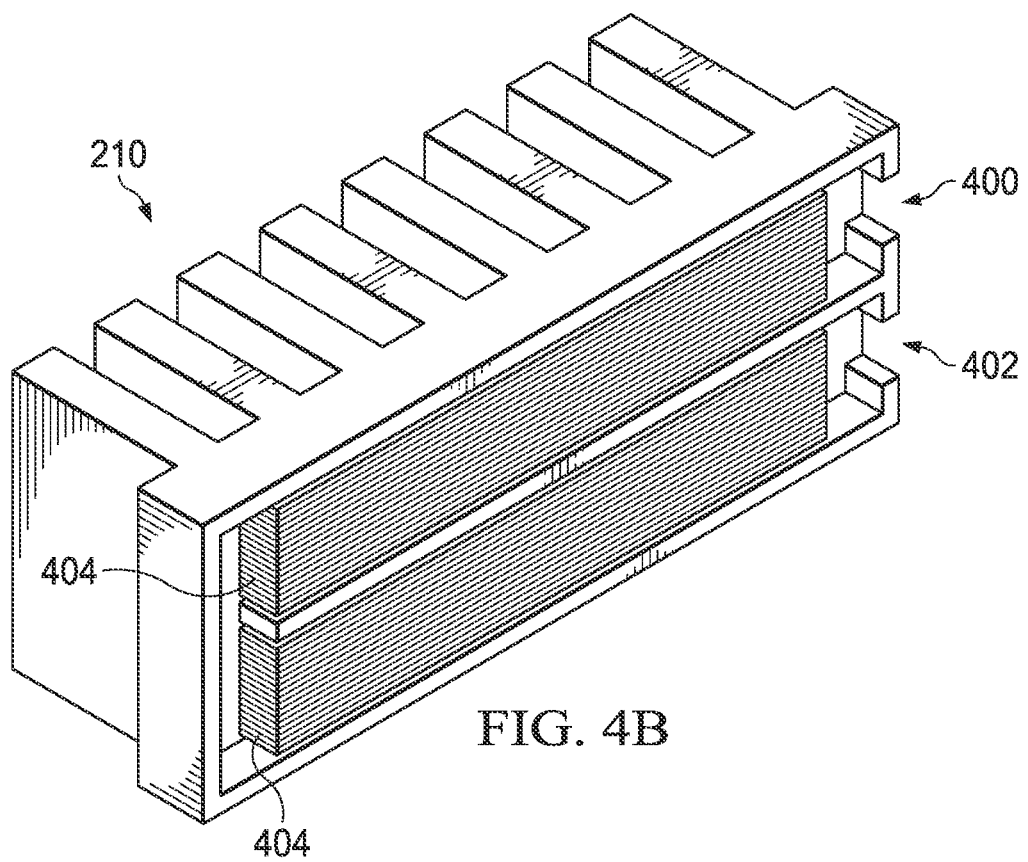
Figure 4C:
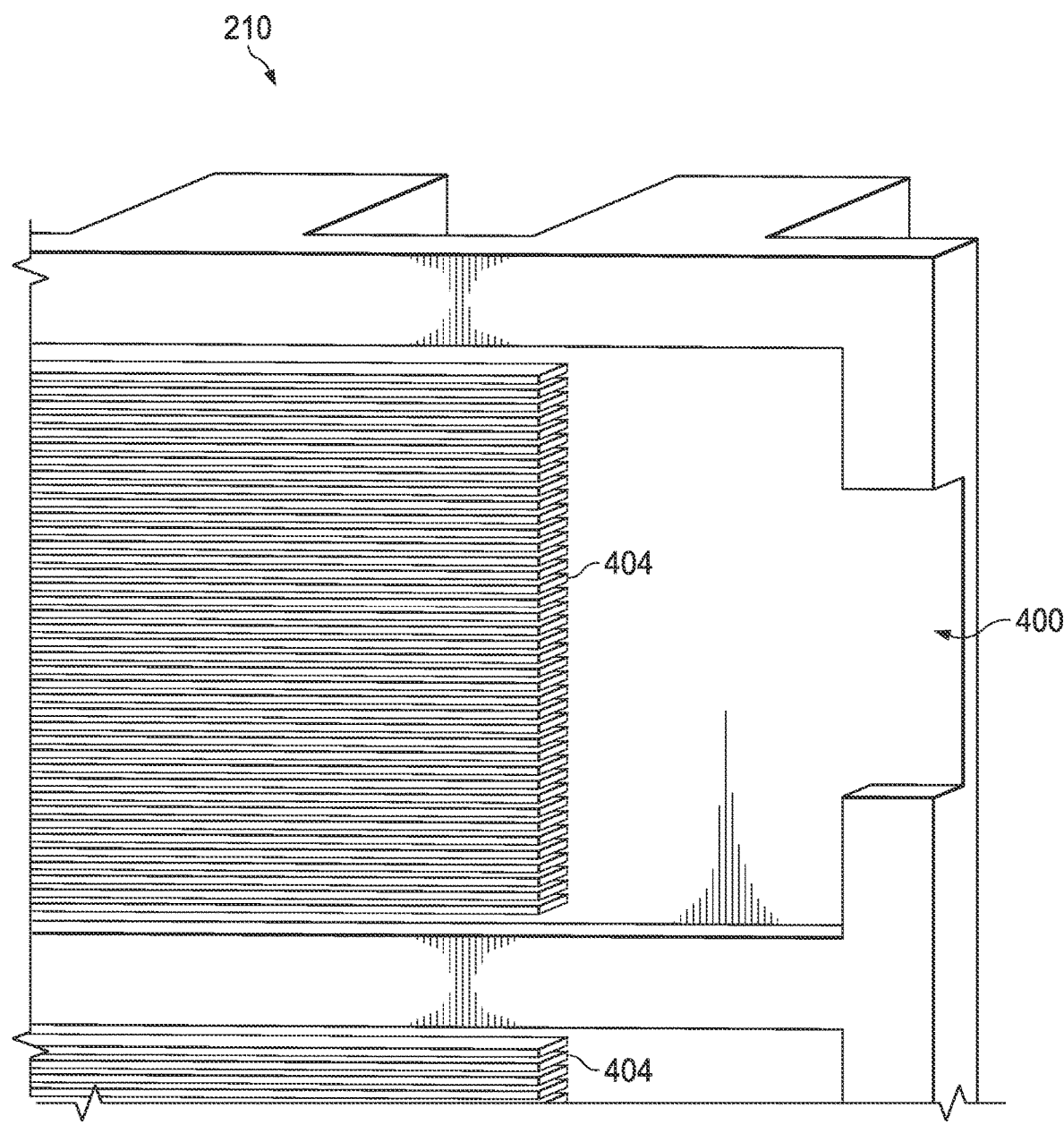

Turning now to FIG. 4 (which includes FIGS. 4A, 4B, and 4C), additional views are shown of cold plate 210. FIG. 4A shows cold plate 210 in isolation. FIG. 4B shows a section view of cold plate 210, exposing fluid inlet 400, fluid outlet 402, and fins 404. FIG. 4C shows a detail section view of cold plate 210, including fluid inlet 400 and a portion of fins 404.

As one of ordinary skill in the art with the benefit of this disclosure will appreciate, fluid inlet 400 and fluid outlet 402 may be coupled to a liquid cooling system using any desired type of fittings. After absorbing heat from cold plate 210, the cooling liquid may flow to a radiator, thermoelectric cooler, or any suitable heat-exchanging component, which may be located elsewhere in the information handling system (or outside of the information handling system's chassis) to be cooled and recirculated.

Figure 5A:
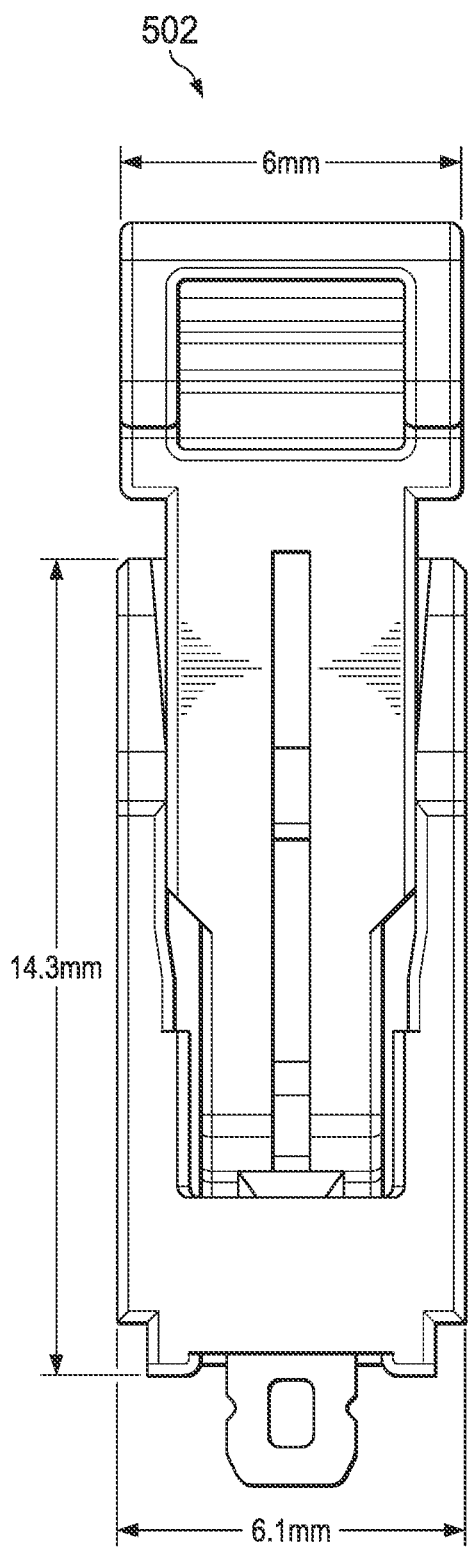
FIGS. 5A-5B illustrate memory module sockets, in accordance with embodiments of the present disclosure.
Figure 5B:
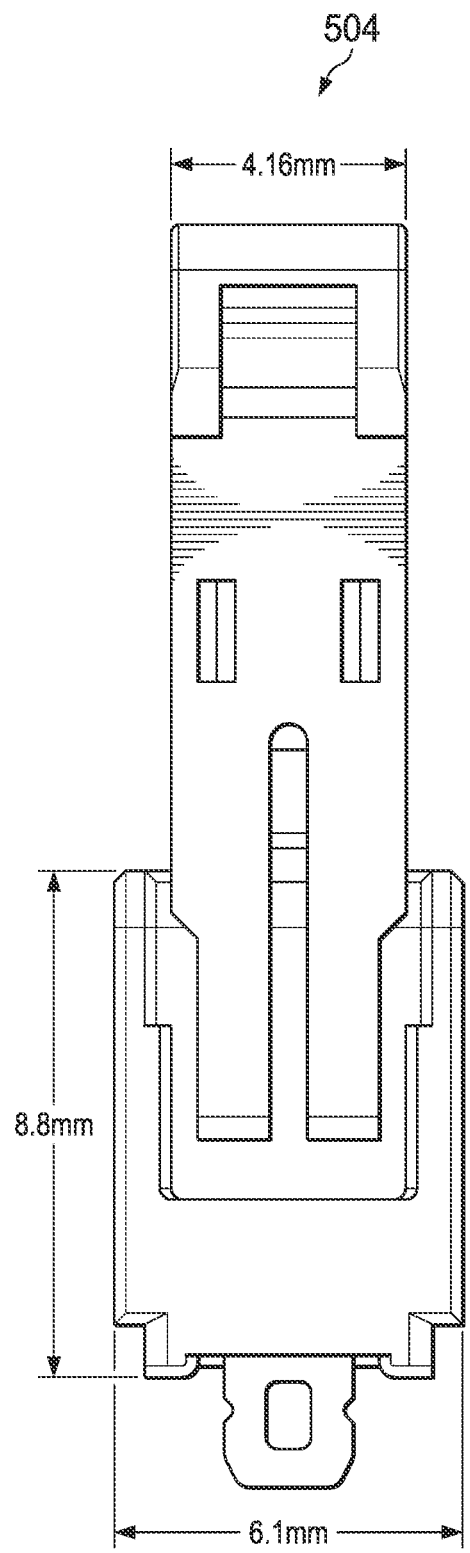

As shown in FIG. 2, DIMMs may be received in sockets that are mounted on a printed circuit board (PCB) such as a motherboard, backplane, etc. In some embodiments, additional advantages may be realized by the use of thin, low-profile DIMM sockets. FIGS. 5A and 5B respectively illustrate examples of a standard DIMM socket 502 and a thin, low-profile DIMM socket 504.

In embodiments using standard DIMM sockets, it may be necessary or advantageous to reduce the thickness of heatsinks 206 at their lateral ends, in order to account for the thickness of the DIMM socket hardware (e.g., such as the DIMM socket latches in particular).

The reduced dimensions of DIMM socket 504 may allow for heatsinks 206 to exit the DIMM area and contact cold plate 210 without such thickness reduction. This may allow for higher heat transfer capabilities as well as reduced heatsink manufacturing complexity.

Although various possible advantages with respect to embodiments of this disclosure have been described, one of ordinary skill in the art with the benefit of this disclosure will understand that in any particular embodiment, not all of such advantages may be applicable. In any particular embodiment, some, all, or even none of the listed advantages may apply.

This disclosure encompasses all changes, substitutions, variations, alterations, and modifications to the exemplary embodiments herein that a person having ordinary skill in the art would comprehend. Similarly, where appropriate, the appended claims encompass all changes, substitutions, variations, alterations, and modifications to the exemplary embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

Unless otherwise specifically noted, articles depicted in the drawings are not necessarily drawn to scale. However, in some embodiments, articles depicted in the drawings may be to scale.

Further, reciting in the appended claims that a structure is "configured to" or "operable to" perform one or more tasks is expressly intended not to invoke 35 U.S.C. § 112(f) for that claim element. Accordingly, none of the claims in this application as filed are intended to be interpreted as having means-plus-function elements. Should Applicant wish to invoke § 112(f) during prosecution, Applicant will recite claim elements using the "means for [performing a function]" construct.

All examples and conditional language recited herein are intended for pedagogical objects to aid the reader in understanding the invention and the concepts contributed by the inventor to furthering the art, and are construed as being without limitation to such specifically recited examples and conditions. Although embodiments of the present inventions have been described in detail, it should be understood that various changes, substitutions, and alterations could be made hereto without departing from the spirit and scope of the disclosure.

What is claimed is:

1. An information handling system comprising:
   a circuit board that includes a plurality of memory module sockets;
   a plurality of memory modules received in the plurality of memory module sockets;
   a plurality of heatsinks disposed between adjacent ones of the plurality of memory modules, wherein the memory modules and the heatsinks are bonded together to form a group that is simultaneously insertable into and simultaneously removable from the plurality of memory module sockets; and
   a cold plate having projections that extend into regions between adjacent ones of the plurality of heatsinks.

2. The information handling system of claim 1, further comprising gap pads disposed between the memory modules and the heatsinks.

3. The information handling system of claim 1, wherein the heatsinks include heatpipes.

4. The information handling system of claim 1, wherein the heatsinks include vapor chambers.

5. The information handling system of claim 1, wherein the cold plate includes a fluid channel disposed therein that is configured to receive a liquid coolant.

6. The information handling system of claim 5, further comprising:
   a pump and tubing configured to convey the liquid coolant through the fluid channel; and
   internal fins within the fluid channel configured to convey heat from the cold plate to the liquid coolant.

7. The information handling system of claim 1, wherein the cold plate includes external fins thereon.

8. The information handling system of claim 7, further comprising an air mover configured to direct an airflow across the external fins.

9. A method comprising:
   coupling a plurality of memory modules to a plurality of heatsinks to form a group, such that in the group, the plurality of heatsinks are disposed between adjacent ones of the plurality of memory modules;
   inserting the memory modules of the group simultaneously into a plurality of memory module sockets disposed on a circuit board; and
   thermally coupling a cold plate to the group such that projections of the cold plate extend into regions between adjacent ones of the plurality of heatsinks.

10. The method of claim 9, wherein the plurality of heatsinks have surface features corresponding to surface features of the plurality of memory modules.

11. The method of claim 9, wherein coupling the plurality of memory modules to the plurality of heatsinks comprises bonding the plurality of memory modules to the plurality of heatsinks with a thermal interface material.

12. The method of claim 11, wherein the thermal interface material comprises a thermal epoxy.

13. An apparatus comprising:
    a group comprising a plurality of memory modules coupled to a plurality of heatsinks, such that in the group, the plurality of heatsinks are disposed between adjacent ones of the plurality of memory modules; and
    a cold plate thermally coupled to the group such that projections of the cold plate extend into regions between adjacent ones of the plurality of heatsinks;
    wherein the memory modules of the group are simultaneously insertable into a plurality of memory module sockets disposed on a circuit board.

14. The apparatus of claim 13, further comprising gap pads disposed between the memory modules and the heatsinks.

15. The apparatus of claim 14, wherein the gap pads comprise thermal epoxy.

16. The apparatus of claim 13, wherein the heatsinks include heatpipes.

17. The apparatus of claim 13, wherein the heatsinks include vapor chambers.

18. The apparatus of claim 13, wherein the cold plate includes a fluid channel disposed therein that is configured to receive a liquid coolant.

19. The apparatus of claim 13, wherein the memory modules are dual in-line memory modules (DIMMs).

20. The apparatus of claim 13, wherein the cold plate includes external fins thereon.

* * * * *